(12) United States Patent
Shimada (10) Patent No.: US 9,066,422 B2
(45) Date of Patent: Jun. 23, 2015

(54) ELECTRONIC COMPONENT

(75) Inventor: Osamu Shimada, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 194 days.

(21) Appl. No.: 13/520,980

(22) PCT Filed: Jan. 4, 2011

(86) PCT No.: PCT/JP2011/000002
§ 371 (c)(1),
(2), (4) Date: Jul. 6, 2012

(87) PCT Pub. No.: WO2011/083753
PCT Pub. Date: Jul. 14, 2011

(65) Prior Publication Data
US 2012/0281379 A1     Nov. 8, 2012

(30) Foreign Application Priority Data

Jan. 8, 2010    (JP) ............................... P2010-003255
Dec. 14, 2010    (JP) ............................... P2010-278004

(51) Int. Cl.
*H05K 7/06*       (2006.01)
*H05K 1/02*       (2006.01)
(Continued)

(52) U.S. Cl.
CPC ............. *H05K 1/023* (2013.01); *H01L 21/486* (2013.01); *H01L 23/3121* (2013.01);
(Continued)

(58) Field of Classification Search
CPC ............... H01L 21/4857; H01L 21/78; H01L 23/49822; H01L 27/3279; H01L 27/329; H01L 28/60; H01L 29/155; H05K 1/0298; H05K 3/00; H05K 2201/10166; H05K 3/10; H05K 3/46; H03F 1/0277; H03F 2203/7203; H03F 2203/7236; H03F 3/19; H03F 3/191; H03F 3/21; H03F 3/211; H03F 3/245

USPC .................... 324/691, 720; 345/174; 438/14; 361/782, 783, 761, 767; 257/777
See application file for complete search history.

(56) References Cited

U.S. PATENT DOCUMENTS 8,193,624 B1 *   6/2012   Sohn ............................. 257/686
8,450,853 B2 *   5/2013   Uchiyama .................... 257/773
(Continued)

FOREIGN PATENT DOCUMENTS

JP     2001-085803     3/2001
JP     2002-271025 A    9/2002
(Continued)

OTHER PUBLICATIONS

English-language International Search Report issued by the Japanese Patent Office in International Patent Application No. PCT/JP2011/000002, mailed Apr. 12, 2011 (2 pages).
(Continued)

*Primary Examiner* — Hung S Bui
*Assistant Examiner* — Michael Matey
(74) *Attorney, Agent, or Firm* — Finnegan, Henderson, Farabow, Garrett & Dunner, L.L.P.

(57) ABSTRACT

In an electronic component in which a semiconductor chip (semiconductor element) and a passive component are integrated on a multilayer wiring board and the semiconductor chip and the passive component constitute a feedback circuit, an input end and an output end of the semiconductor chip (semiconductor element) are electrically separated from each other. The electronic component includes the multilayer wiring board, the semiconductor chip disposed on the main surface of or inside the multilayer wiring board, and the passive component having a first terminal and a second terminal connected to the input end and the output end of the semiconductor chip respectively, and is configured such that a conductive member constituting the multilayer wiring board is located at a position where a distance from at least one of the first terminal and the second terminal is smaller than a distance between the first terminal and the second terminal.

8 Claims, 9 Drawing Sheets

(51) Int. Cl.
*H01L 21/48* (2006.01)
*H01L 23/498* (2006.01)
*H01L 23/538* (2006.01)
*H05K 1/18* (2006.01)
*H05K 3/46* (2006.01)
*H01L 23/31* (2006.01)
*H05K 3/40* (2006.01)
*H01L 23/00* (2006.01)

(52) U.S. Cl.
CPC ..... *H01L 23/49827* (2013.01); *H01L 23/5383* (2013.01); *H01L 23/5389* (2013.01); *H01L 2224/48091* (2013.01); *H01L 2224/48227* (2013.01); *H01L 2924/01004* (2013.01); *H01L 2924/01079* (2013.01); *H05K 1/0224* (2013.01); *H05K 1/186* (2013.01); *H05K 3/4069* (2013.01); *H05K 3/4614* (2013.01); *H05K 3/4647* (2013.01); *H05K 2201/0355* (2013.01); *H05K 2201/10636* (2013.01); *H05K 2203/061* (2013.01); *H05K 2203/063* (2013.01); *H01L 24/48* (2013.01); *H01L 2924/3025* (2013.01)

(56) References Cited

U.S. PATENT DOCUMENTS

| | | | |
|---|---|---|---|
| 2002/0135058 A1* | 9/2002 | Asahi et al. | 257/687 |
| 2003/0136577 A1* | 7/2003 | Abe | 174/255 |
| 2004/0140556 A1* | 7/2004 | Lin et al. | 257/723 |
| 2004/0160752 A1* | 8/2004 | Yamashita et al. | 361/766 |
| 2004/0184219 A1* | 9/2004 | Otsuka et al. | 361/306.3 |
| 2005/0218502 A1* | 10/2005 | Sunohara et al. | 257/700 |
| 2006/0145359 A1* | 7/2006 | Sunohara et al. | 257/778 |
| 2006/0237225 A1* | 10/2006 | Kariya et al. | 174/260 |
| 2007/0096160 A1* | 5/2007 | Beroz et al. | 257/232 |
| 2007/0096292 A1* | 5/2007 | Machida | 257/700 |
| 2007/0161266 A1* | 7/2007 | Nishizawa | 439/69 |
| 2009/0008765 A1* | 1/2009 | Yamano et al. | 257/690 |
| 2009/0051024 A1* | 2/2009 | Chia | 257/686 |
| 2009/0065920 A1* | 3/2009 | Ahn et al. | 257/686 |
| 2010/0244230 A1* | 9/2010 | Oi | 257/692 |
| 2011/0037164 A1* | 2/2011 | Kwon et al. | 257/709 |
| 2011/0127664 A1* | 6/2011 | Antesberger et al. | 257/692 |

FOREIGN PATENT DOCUMENTS

| | | |
|---|---|---|
| JP | 2005-294383 A | 10/2005 |
| JP | 2005-302942 A | 10/2005 |
| JP | 2008-283114 | 11/2008 |
| JP | 2009-246144 | 10/2009 |
| KR | 10-2006-0044472 A | 5/2006 |

OTHER PUBLICATIONS

International Preliminary Report on Patentability and Written Opinion issued by the International Bureau of WIPO on Aug. 7, 2012, for International Application No. PCT/JP2011/000002.

* cited by examiner

ELECTRONIC COMPONENT

CROSS REFERENCE TO RELATED APPLICATIONS

This application is a national phase application based on PCT/JP2011/000002, filed Jan. 4, 2011, which claims the priority of Japanese Patent Application No. 2010-003255, filed Jan. 8, 2010, and Japanese Patent Application No. 2010-278004, filed Dec. 14, 2010, the content of all of which is incorporated herein by reference.

TECHNICAL FIELD

The present invention relates to a high-density mounting electronic component in which a semiconductor chip and a passive component are integrated on a multilayer wiring board.

BACKGROUND ART

With the reduction in size, weight and thickness of electronic components, a high-density mounting electronic component in which electronic components are combined (a plurality of electronic components are combined to form one electronic component) is under development. With respect to the high-density mounting, a semiconductor chip (semiconductor element) and a passive component (inductor, capacitor, resistor) are integrated on a multilayer wiring board to constitute one electronic component (for example, hybrid IC (integrated circuit)).

On the other hand, in order to constitute a feedback circuit mainly including the semiconductor chip (semiconductor element), a feedback element is connected to the semiconductor chip (semiconductor element). For example, the passive component (feedback element) is connected between the input end and the output end of the semiconductor chip (semiconductor element) so that a signal is fed back from the output side to the input side (see, for example, Reference 1).

When constituting the feedback circuit, it is necessary to achieve electrical separation between the input end and the output end of the semiconductor chip (semiconductor element). If the separation between the input end and the output end is not well achieved, an output signal from the output end becomes a resonant condition, failing to obtain a desired output signal. Moreover, the semiconductor chip (semiconductor element) itself may be broken due to the influence of the above-described resonance.

However, in the electronic component made by incorporating and highly densely mounting the semiconductor chip (semiconductor element) and the passive component on the multilayer wiring board, it is difficult to provide means which can electrically separate the input end and the output end of the semiconductor chip (semiconductor element) from each other because of the reduction in size between wiring substrates.

REFERENCES

Patent Reference

Reference 1: JP-A 2001-085803 (KOKAI)

SUMMARY OF THE INVENTION

Problems to be Solved by the Invention

An object of the present invention is to provide an electronic component in which a semiconductor chip (semiconductor element) and a passive component are integrated on a multilayer wiring board and the semiconductor chip and the passive component constitute a feedback circuit, in which the input end and the output end of the semiconductor chip (semiconductor element) are electrically separated from each other.

Means for Solving the Problems

An electronic component according to an aspect of the present invention includes: a multilayer wiring board; a semiconductor chip disposed on a main surface of or inside the multilayer wiring board; and a passive component disposed inside the multilayer wiring board and having a first terminal and a second terminal connected to an input end and an output end of the semiconductor chip respectively, wherein a conductive member constituting the multilayer wiring board is disposed at a position where a distance from at least one of the first terminal and the second terminal is smaller than a distance between the first terminal and the second terminal.

Effect of the Invention

According to the present invention, in a semiconductor chip (semiconductor element) and a passive component are integrated on a multilayer wiring board and the semiconductor chip and the passive component constitute a feedback circuit, an input end from an output end of the semiconductor chip (semiconductor element) can be electrically separated from each other.

MODE FOR CARRYING OUT THE INVENTION

Hereinafter, embodiments of the present invention will be described in detail referring to the drawings.
(First Embodiment)

Figure 1:
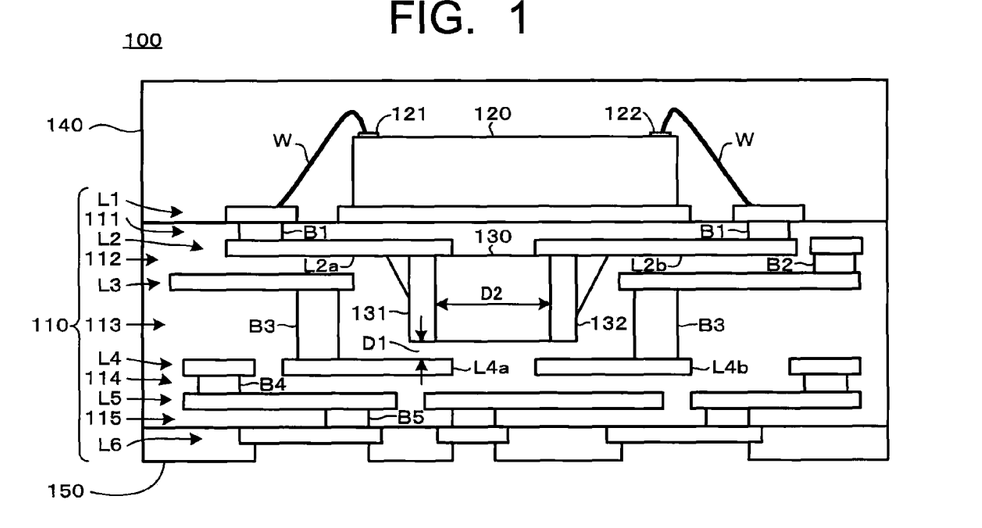
FIG. 1 is a sectional view illustrating an electronic component according to a first embodiment of the present invention.

FIG. 1 is a sectional view illustrating an electronic component 100 in a first embodiment of the present invention. The electronic component 100 has a multilayer wiring board 110, a semiconductor chip 120, a passive component 130, a sealing layer 140, and a protective layer 150.

The multilayer wiring board 110 has insulating layers 111 to 115 and wiring layers L1 to L6. The wiring layers L1 to L6 are arranged in order from the bottom to the top of the board 110 and electrically insulated by the insulating layers 111 to 115 respectively. Note that the insulating layers 111 to 115 are layers made of an insulating material such as resin. The wiring layers L1 to L6 are layers having wirings constituted of a pattern of a conductive material such as metal. The wiring layers L1 to L6 are electrically connected to each other by interlayer connecting parts B1 to B5 such as conductive bumps.

In this embodiment, for example, the semiconductor chip 120 is composed of a semiconductor chip such as silicon and constitutes an amplifier (for example, an OP amplifier). Further, an input end 121 is provided at the left end on the upper face of the semiconductor chip 120 and an output end 122 is provided at the right end on the upper face of the semiconductor chip 120. The semiconductor chip 120 amplifies a signal inputted into the input end 121 and outputs it to the output end 122. Note that the input end 121 and the output end 122 are connected to the wirings of the wiring layer L1 of the multilayer wiring board 110 via wires W respectively.

In this embodiment, the passive component 130 is provided inside the multilayer wiring board 110 and directly under the semiconductor chip 120 so as to be opposed to the semiconductor chip 120. A first terminal 131 and a second terminal 132 of the passive component 130 are connected to the wiring layer L2 by solder or the like. As a result, the first terminal 131 and the second terminal 132 of the passive component 130 are connected to the input terminal 121 and the output terminal 122 of the semiconductor chip 120 via the wiring layer L2, the interlayer connecting parts B1, the wiring layer L1, and the wires W to constitute a feedback circuit.

The passive component 130 is a feedback element and is a chip component constituting, for example, an inductor, a capacitor, a resistor or the like.

Figure 2:
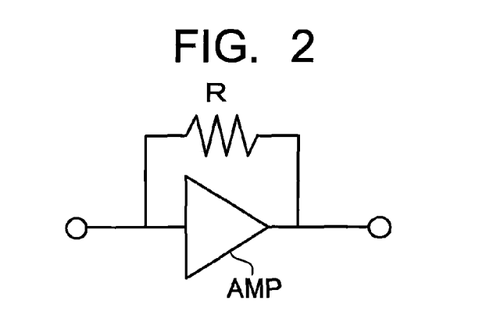
FIG. 2 is a circuit diagram illustrating an example of a circuit constituted by a semiconductor chip and a passive component of the electronic component illustrated in FIG. 1.

If the passive component 130 is a chip component constituting the resistor, the above-described feedback circuit will constitute a circuit as illustrated in FIG. 2. In other words, an analog circuit is constituted of an amplifier AMP and a feedback resistor element R which are combined with one another.

The sealing layer 140 is, for example, a resin layer for sealing the semiconductor chip 120 to protect it from the outside.

The protective layer 150 is, for example, a resist layer for protecting the wiring layer L6 from the outside. The protective layer 150 is formed with openings and not-illustrated metal terminals for electrically connecting to an external circuit and an external element.

Figure 3:
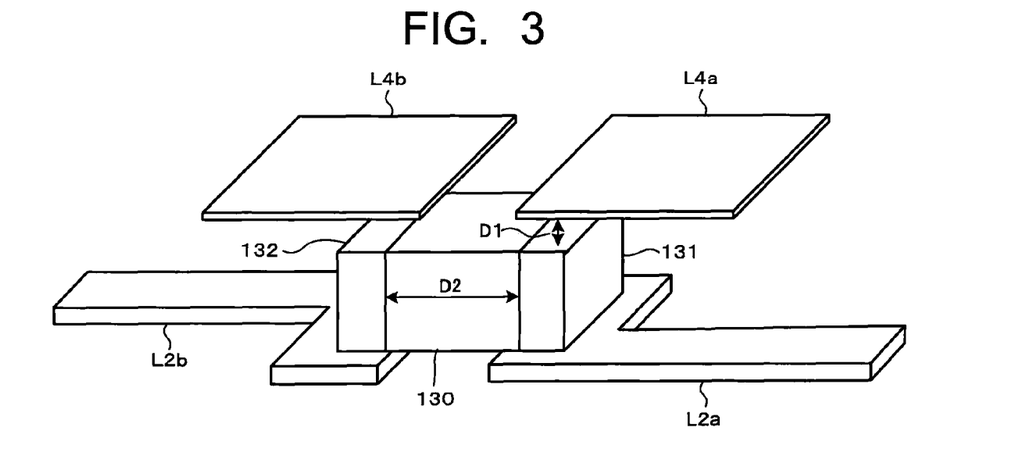
FIG. 3 is an enlarged perspective view illustrating, in an enlarged scale, the vicinity of the passive component of the electronic component illustrated in FIG. 1.

FIG. 3 is an enlarged perspective view illustrating, in an enlarged scale, the vicinity of the passive component 130. FIG. 3 illustrates the electric component placed upside down as compared to that illustrated in FIG. 1 in order to clarify the features of this embodiment.

As illustrated in FIG. 3, the wirings L2a, L2b of the wiring layer L2 as the conductive member constituting the multilayer wiring board 110 are connected to the first terminal 131 and the second terminal 132 of the passive component 130, and the wirings L4a, L4b of the wiring layer L4 are arranged close to the first terminal 131 and the second terminal 132 of the passive component 130. Further, as compared to the distance D2 between the first terminal 131 and the second terminal 132, the distance D1 between the first terminal 131 and the second terminal 132 and the wirings L4a, L4b is smaller.

As a result of this, an AC noise generated from the first terminal 131 and the second terminal 132 of the passive component 130 is absorbed by the wirings L4a, L4b. Accordingly, it is possible to prevent the AC noise from being superimposed on the semiconductor chip 120 and thereby electrically separate the input end 121 and the output end 122 of the semiconductor chip 120 from each other. Consequently, it is possible to prevent resonance of the semiconductor chip 120 to obtain a desired output signal and prevent breakage of the semiconductor chip 120.

Further, the wirings L4a, L4b can be connected to the ground. In this case, since the above-described AC noise is released to the outside of the multilayer wiring board 110, that is, the electronic component, it is possible to more effectively suppress the superimposition of the AC noise on the semiconductor chip 120 and to more surely achieve electrical separation between the input end 121 and the output end 122 of the semiconductor chip 120.

Note that though the wiring L4a and the wiring L4b are arranged close to the first terminal 131 and the second terminal 132 of the passive element 130 by the distance D1 in this embodiment, the above-described operation and effect can be provided only by arranging one of the wiring L4a and the wiring L4b close to the first terminal 131 or the second terminal 132 by the distance D1. However, the above-described operation and effect can be more effectively provided by arranging the wiring L4a and the wiring L4b close to the first terminal 131 and the second terminal 132 by the distance D1 respectively.

Further, the passive component 130 is disposed inside the multilayer wiring board 110 and directly under the semiconductor chip 120 so as to be opposed to the semiconductor chip 120 in this embodiment. Accordingly, the passive component 130 is shielded by the wiring layers L3 to L6 located below the passive component 130 and the semiconductor chip 120 located above the passive component 130 so that the flow of the external noise thereinto can be reduced. Further, since the arrangement of the passive component 130 directly under the semiconductor chip 120 reduces the wiring length between the passive component 130 and the semiconductor chip 120, the influence of the external noise on the passive component 130 can be further reduced.

Note that the wiring L4a and the wiring L4b are located below the passive component 130 in the multilayer wiring board 110 in this embodiment, but can be located above the passive component 130.
(Comparative Example)

Figure 4:
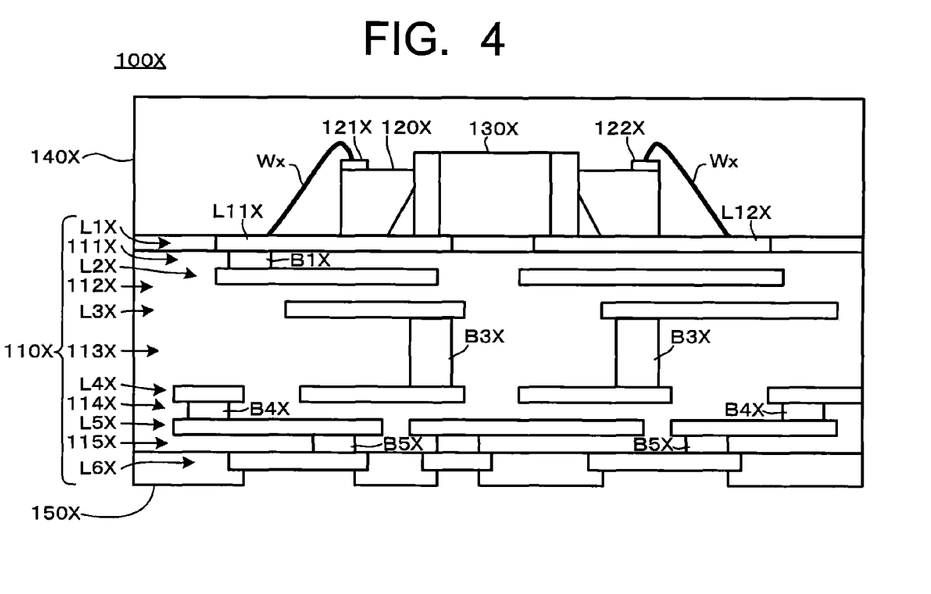
FIG. 4 is a sectional view illustrating an electronic component according to a comparative example of the present invention.
Figure 5:
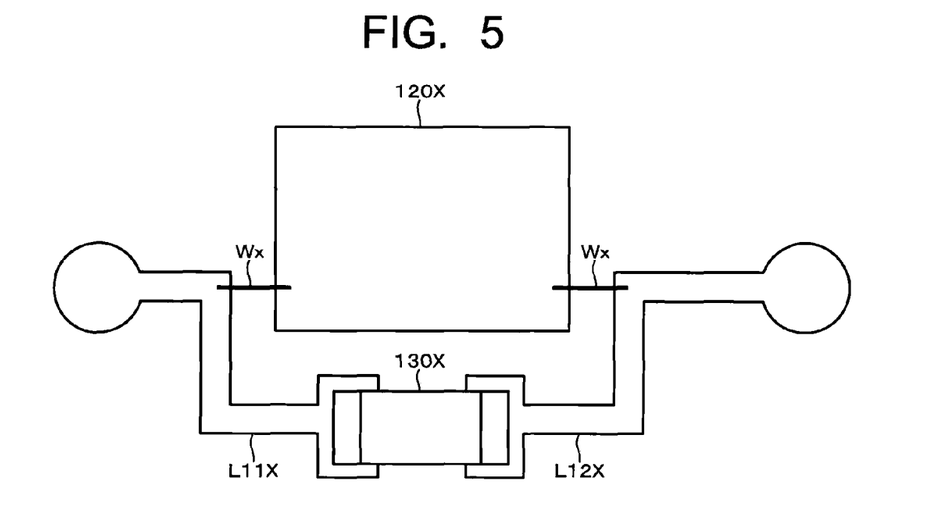
FIG. 5 is a plan view illustrating the state of a semiconductor chip and a passive component in the electronic component illustrated in FIG. 4 as viewed from above.

FIG. 4 is a sectional view illustrating an electronic component 100X according to a comparative example of the present invention. FIG. 5 is a plan view illustrating the state of a semiconductor chip 120X and a passive component 130X as viewed from above. The electronic component 100X has a multilayer wiring board 110X, the semiconductor chip 120X, the passive component 130X, a sealing layer 140X, and a protective layer 150X. Wiring layers L1X to L6X are arranged in order from the bottom to the top and electrically insulated by insulating layers 111X to 115X respectively. Note that the insulating layers 111X to 115X are layers made of an insulating material such as resin. Further, the wiring layers L1X to L6X are layers having wirings constituted of a pattern of a conductive material such as metal. The wiring layers L1X to L6X are electrically connected to each other by interlayer connecting parts B1X to B5X such as conductive bumps.

As illustrated in FIG. 4 and FIG. 5, the passive component 130X is disposed not inside the multilayer wiring board 110X but on a main surface of the multilayer wiring board 110X and along with the semiconductor chip 120X in this comparative example. The first terminal 131X and the second terminal 132X of the passive component 130X are connected to wirings L11X and L12X of the wiring layer L1X, and the input end 121X and the output end 122X of the semiconductor chip 120X are similarly connected to the wirings L11X and L12X of the wiring layer L1X via wires Wx.

In the electronic component 100X, since the semiconductor chip 120X and the passive component 130X are arranged on the multilayer wiring board 110X, the passive component 130X needs to be disposed so as to be sufficiently away from the semiconductor chip 120X so that the AC noise generated in the passive component 130X is not superimposed on the semiconductor chip 120X. Therefore, it becomes difficult to obtain a high-density mounting electronic component.

Further, since the passive component 130X is exposed to the surface, the passive component 130X is susceptive to the external noise. Accordingly, it becomes necessary to separately provide a shielding member for the passive component 130X to reduce the influence of the external noise. Accordingly, the provision of the shielding member makes it difficult to obtain a high-density mounting electronic component as well as requires a new manufacturing process of providing the shielding member, resulting in complicated manufacturing process of the electronic component 100X.

(Manufacturing Method of Electronic Component 100)

A manufacturing method of the electronic component 100 will be described below. For manufacturing the electronic component 100, the multilayer wiring board 110 having the passive component 130 built-in is produced first. In this event, the multilayer wiring board 110 is produced under the state of division into an upper layer part 110A, a middle layer part 110B, and a lower layer part 110C. Then, the upper layer part 110A, the middle layer part 110B, and the lower layer part 110C are united with one other to form the multilayer wiring board 110.

A. Production of Upper Layer Part 110A (FIG. 6)

The upper layer part 110A has the insulating layer 111, the wiring layers L1, L2 and the passive component 130.

Figure 6A:
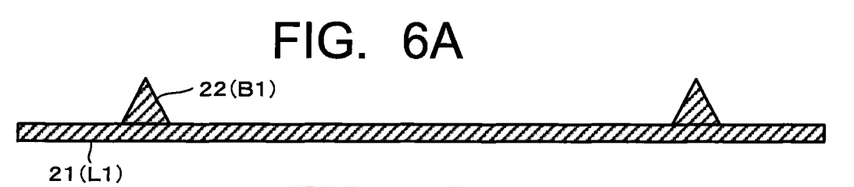
FIG. 6 are views illustrating manufacturing processes of the electronic component illustrated in FIG. 1.

(1) Formation of Conductive Bump 22 on Metal Foil 21 (FIG. 6A)

On a metal foil (for example, a copper foil) 21 which will be the wiring layer L1, a conductive bump 22 which will be the interlayer connecting part B1 is formed. The conductive bump 22 is formed, for example, by the screen printing of a conductive paste. The conductive paste is made by dispersing metal particles (silver, gold, copper, solder or the like) in a paste resin and mixing a volatile solvent therein. By printing the conductive paste on the metal foil 21 by the screen printing, the conductive bump 22 in an almost cone shape can be formed.

Figure 6B:
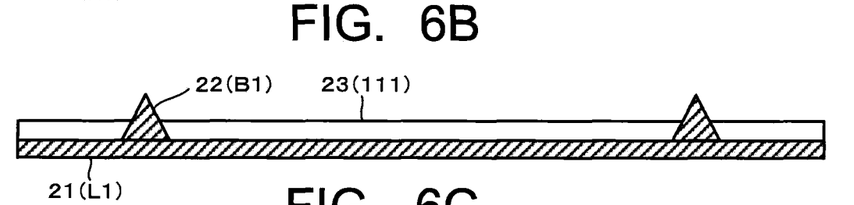

(2) Layering of Pre-preg 23 on Metal Foil 21 (FIG. 6B)

On the metal foil 21 on which the conductive bump 22 has been formed, a pre-preg 23 which is to be the insulating layer 111 is layered. More specifically, the pre-preg 23 is disposed on the metal foil 21 and pressurized. The pre-preg 23 is made by impregnating a reinforcement material such as a glass fiber with a curable resin such as an epoxy resin. Further, before curing, the pre-prep 23 is in a semi-cured state and has a thermoplastic property and a thermosetting property. Since heating is not performed at this layering stage, the pre-preg 23 is kept in an uncured state.

As a result of layering, the conductive bump 22 penetrates the pre-preg 23. This is because the pre-preg 23 has a thermoplastic property and a thermosetting property and the shape of the conductive bump 22 is an almost cone.

Figure 6C:
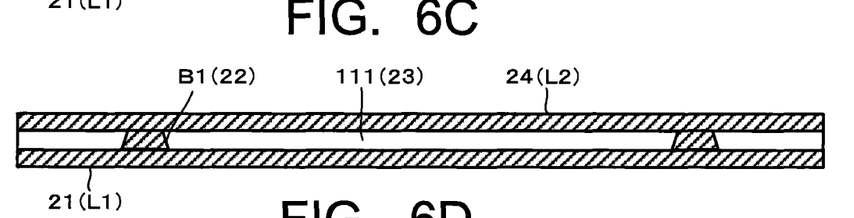

(3) Layering and Heating of Metal Foil 21, Pre-preg 23, Metal Foil 24 (FIG. 6C)

The metal foil 24 is layered on a layered body of the metal foil 21 and the pre-preg 23, and heating is performed thereon while pressurizing them. As a result of this, the pre-preg 23 is cured to form the insulating layer 111 and strongly connected to the metal foils 21, 24. Further, the conductive bump 22 (the interlayer connecting part B1) electrically connects the metal foils 21, 24.

The electrical conduction of the metal foils 21, 24 is realized by the conductive bump 22 without requiring the process such as a through hole formation. Therefore, no space is required for the through hole formation, thus facilitating high-density mounting.

Figure 6D:
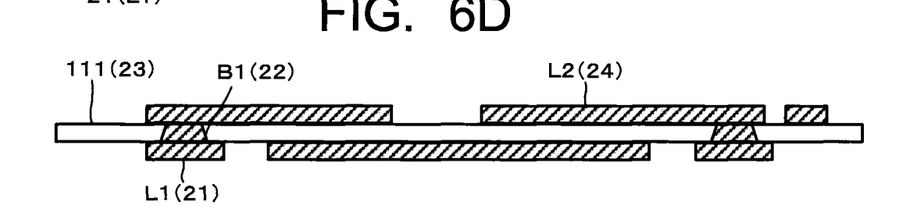

(4) Patterning of Metal Foils 21, 24 (FIG. 6D)

The metal foils 21, 24 are patterned to form the wiring layers L1, L2. The patterning can be performed, for example, by formation of a mask by application and exposure of a photoresist, etching of the metal foils 21, 24 using the mask and so on.

Figure 6E:
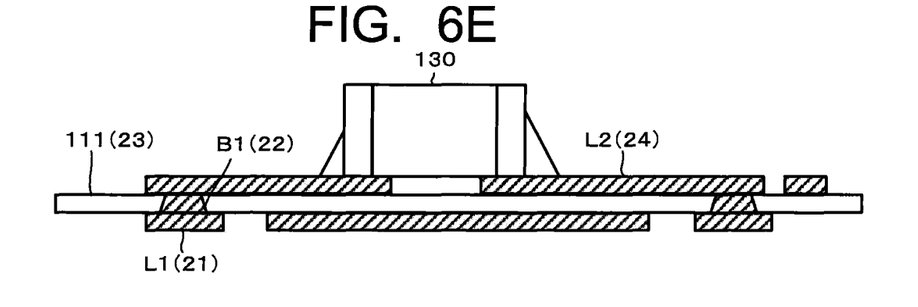

(5) Mounting of Passive Component 130 (FIG. 6E)

The passive component 130 is disposed and fixed on the wiring layer L2.

B. Production of Middle Layer Part 110B (FIG. 7)

The middle layer part 110B corresponds to the insulating layer 112, apart of the insulating layer 113, and the wiring layer L3.

Figure 7A:
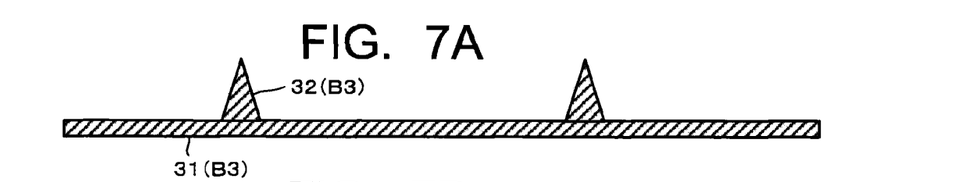
FIG. 7 are views illustrating manufacturing processes of the electronic component illustrated in FIG. 1.

(1) Formation of Conductive Bump 32 on Metal Foil 31 (FIG. 7A)

Next, a conductive bump 32 which will be a part of an interlayer connecting part B3 is formed on a metal foil 32 (for example, a copper foil) 31 which will be a part of the interlayer connecting part B3.

Figure 7B:
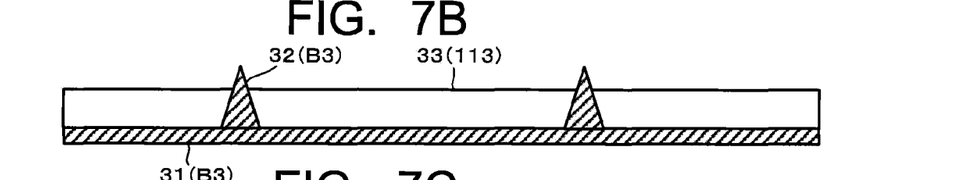

(2) Layering of Pre-preg 33 on Metal Foil 31 (FIG. 7B)

A pre-preg 33 which is to be a part of the insulating layer 113 is layered on the metal foil 31 on which the conductive bump 32 has been formed. More specifically, the pre-preg 23 is disposed on the metal foil 31 and pressurized. As a result of layering, the conductive bump 32 penetrates the pre-preg 33.

Figure 7C:
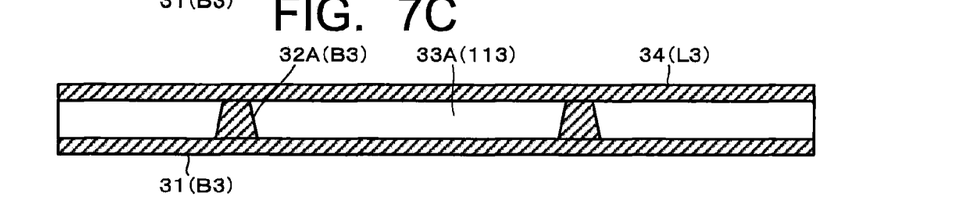

(3) Layering and Heating of Metal Foil 31, Pre-preg 33, Metal Foil 34 (FIG. 7C)

A metal foil 34 is layered on a layered body of the metal foil 31 and the pre-preg 33, and heating is performed thereon while pressurizing them. As a result of this, the pre-preg 33 is cured to form an insulating layer 33A and strongly connected to the metal foils 31, 34. Further, the conductive bump 32 (a part of the interlayer connecting part B3) electrically connects the metal foils 31, 34. The insulating layer 33A and a later-described pre-preg 49 correspond to the insulating layer 113.

Figure 7D:
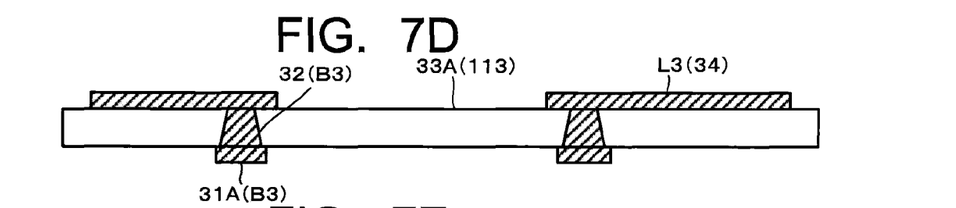

(4) Patterning of Metal Foils 31, 34 (FIG. 7D)

The metal foils 31, 34 are patterned to form a metal foil pattern 31A and the wiring layer L3. The metal foil pattern 31A, the conductive bump 32 and a later-described conductive bump 48 correspond to the interlayer connecting part B3.

Figure 7E:
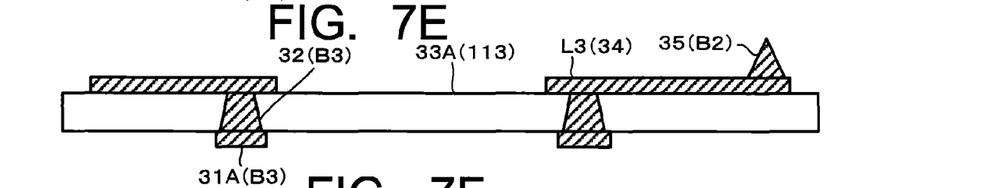

(5) Formation of Conductive Bump 35 on Wiring Layer L3 (FIG. 7E)

On the wiring layer L3, a conductive bump 35 which will be the interlayer connecting part B2 is formed.

Figure 7F:
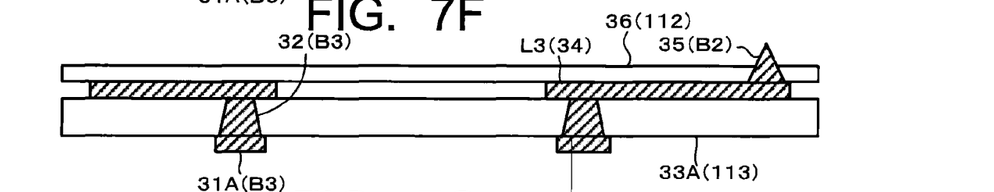

(6) Layering of Pre-preg 36 on Wiring Layer L3 (FIG. 7F)

A pre-preg 36 which is to be the insulating layer 112 is layered on the wiring layer L3. More specifically, the pre-preg 36 is disposed on the metal foil 31 and pressurized. As a result of layering, the conductive bump 35 penetrates the pre-preg 36. Since heating is not performed at this layering stage, the pre-preg 36 is kept in an uncured state.

Figure 7G:
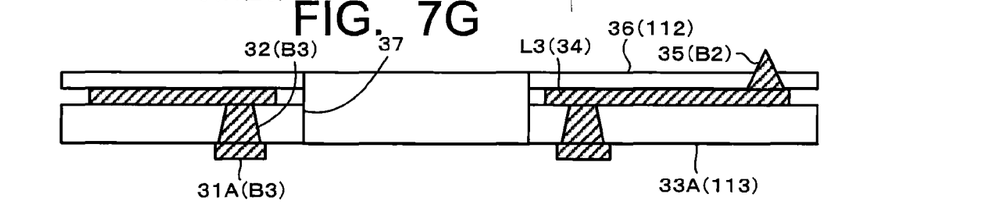

(7) Formation of Through Hole 37 (FIG. 7G)

A through hole 37 is formed in the layered body of the metal foil 31, the pre-preg 33, the metal foil 34, and the pre-preg 36. This through hole 37 becomes a space for housing the passive component 130. When the passive component 130 is thick to a certain degree, such a through hole 37 is necessary.

In this manner, the middle layer part 110B is formed. In this event, the pre-preg 36 is kept in an uncured state for later-described connection with the upper layer part 110A. The middle layer part 110B has the metal foil pattern 31A which will be a part of the interlayer connecting part B3, and the conductive bump 32. In this example, the combination of the insulating layer 33A, the conductive bump 32, and the metal foil pattern 31A is disposed below the pre-preg 36 and the wiring layer L3. Depending on the circumstances, the combination may be further layered.

C. Production of Lower Layer Part 110C (FIG. 8)

The lower layer part 110C has insulating layers 114, 115 and the wiring layers L4 to L6.

Figure 8A:
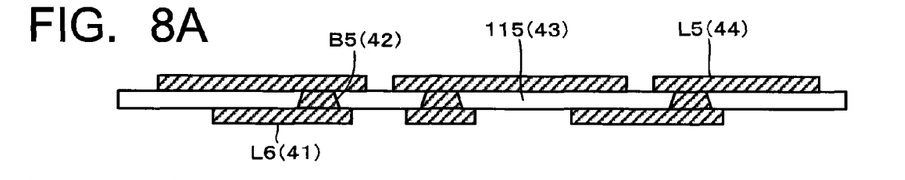
FIG. 8 are views illustrating manufacturing processes of the electronic component illustrated in FIG. 1.

(1) Formation of Layered Body of Wiring Layer L6, Insulating Layer 115, and Wiring Layer L5 (FIG. 8A)

By the following process, the layered body of the wiring layer L6, the insulating layer 115, and the wiring layer L5 is formed.

1) Formation of Conductive Bump 42 (corresponding to Interlayer Connecting Part B5) on Metal Foil 41 (corresponding to Wiring Layer L6)

2) Layering of Pre-preg 43

3) Layering and Heating of Metal Foil 44

4) Patterning of Metal Foils 41, 44

The processes 1) to 4) are the same processes corresponding to already-described FIGS. 6A to 6D and FIGS. 7A to 7D, and therefore detailed description will be omitted.

Figure 8B:
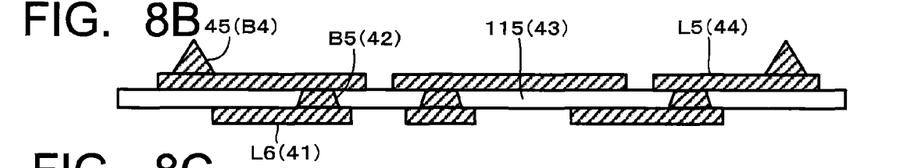

(2) Formation of Conductive Bump 45 on Wiring Layer L5 (FIG. 8B)

A conductive bump 45 which will be the interlayer connecting part B4 is formed on the wiring layer L5.

Figure 8C:
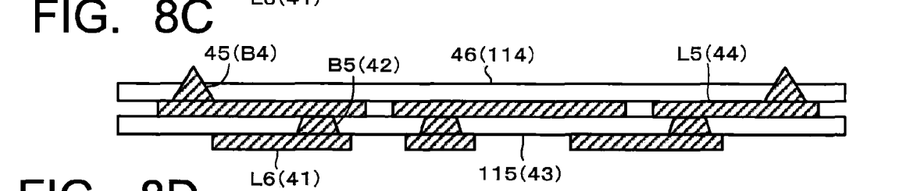

(3) Layering of Pre-preg 46 on Wiring Layer L5 (FIG. 8C)

On the wiring layer L5 on which the conductive bump 45 has been formed, a pre-preg 46 which is to be the insulating layer 114 is layered. More specifically, the pre-preg 46 is disposed on the wiring layer L5 and pressurized. As a result of layering, the conductive bump 45 penetrates the pre-preg 46.

Figure 8D:
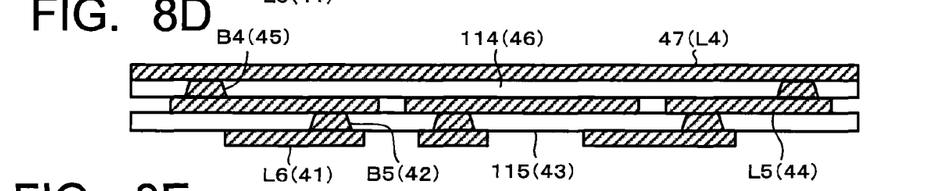

(4) Layering and Heating of Metal Foil 47 (FIG. 8D)

The metal foil 47 is layered on the pre-preg 46, and heating is performed thereon while pressurizing them. As a result of this, the pre-preg 46 is cured to form the insulating layer 114 and strongly connected to the wiring layer L5 and the metal foil 47. Further, the conductive bump 45 (the interlayer connecting part B4) electrically connects the wiring layer L5 and the metal foil 47.

Figure 8E:
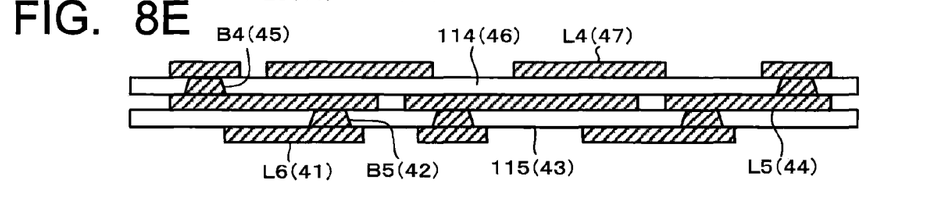

(5) Patterning of Metal Foil 47 (FIG. 8E)

The metal foil 47 is patterned to form the wiring layer L4.

Figure 8F:
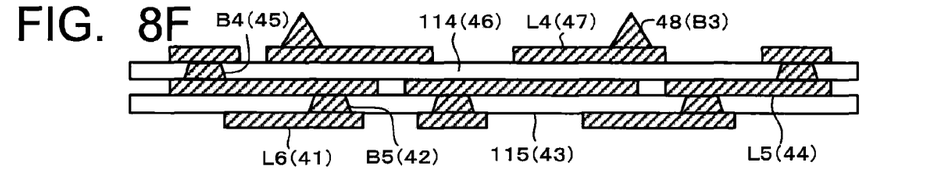

(6) Formation of Conductive Bump 48 on Wiring Layer L4 (FIG. 8F)

A conductive bump 48 which will be a part of the interlayer connecting part B3 is formed on the wiring layer L4.

Figure 8G:
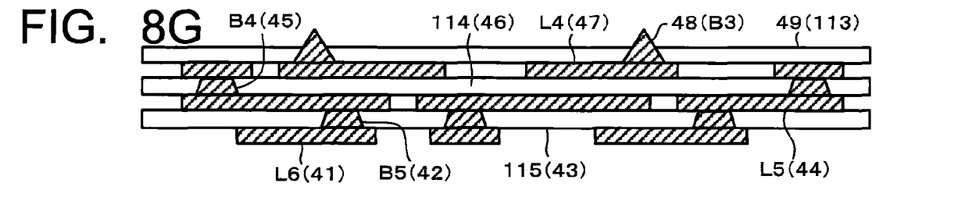

(7) Layering of Pre-preg 49 on Wiring Layer L4 (FIG. 8G)

A pre-preg 49 which is to be a part of the insulating layer 113 is layered on the wiring layer L4 on which the conductive bump 48 has been formed. More specifically, the pre-preg 49 is disposed on the wiring layer L4 and pressurized. As a result of layering, the conductive bump 48 penetrates the pre-preg 49.

In this manner, the lower layer part 110C is formed. In this event, the pre-preg 49 is kept in an uncured state for later-described connection with the middle layer part 110B. The lower layer part 110C has the conductive bump 48 which will be a part of the interlayer connecting part B3.

Figure 9:
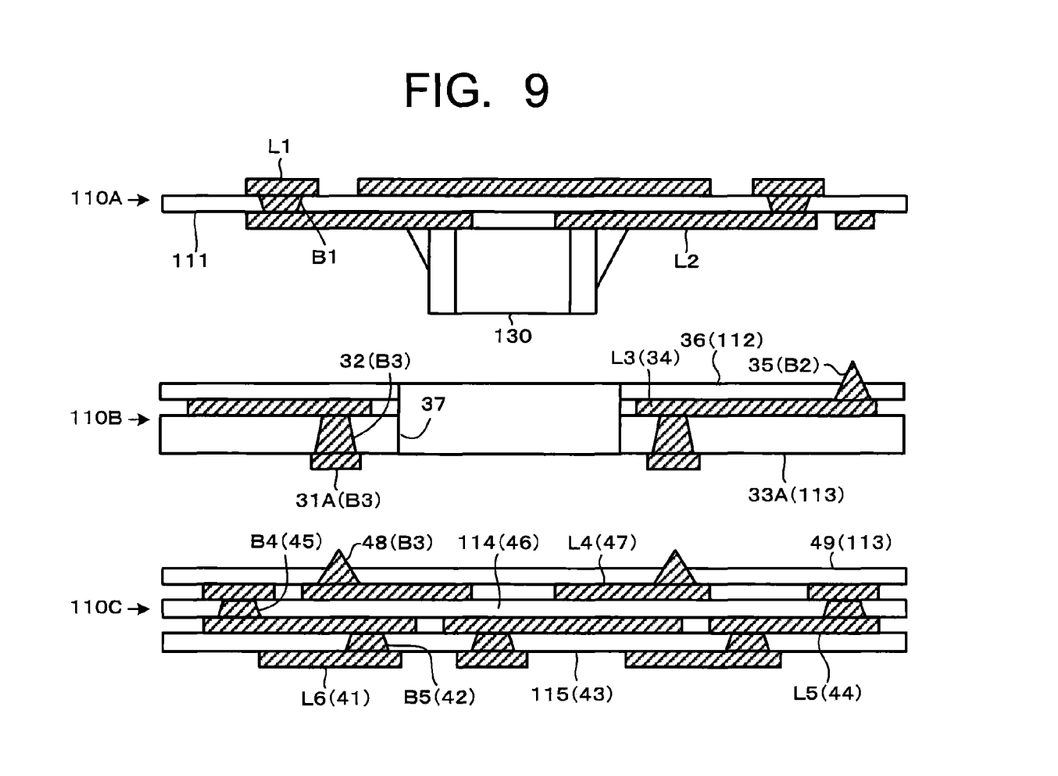
FIG. 9 is a view illustrating a manufacturing process of the electronic component illustrated in FIG. 1.
Figure 10:
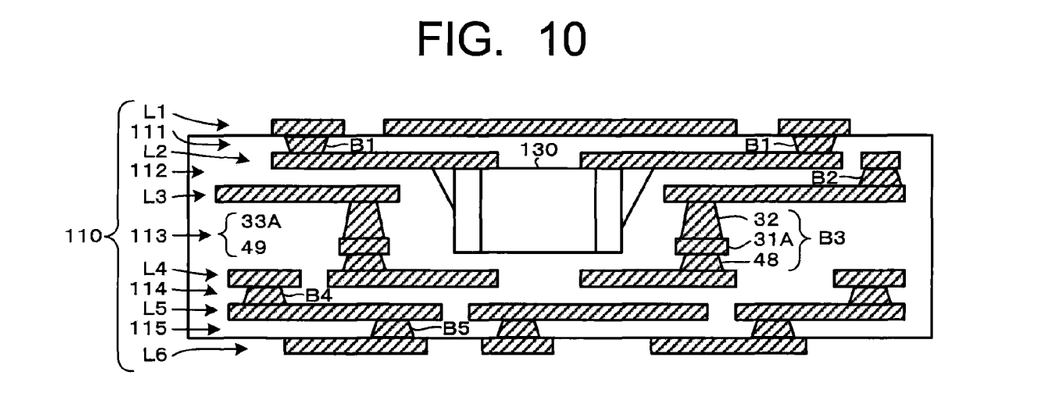
FIG. 10 is a view illustrating a manufacturing process of the electronic component illustrated in FIG. 1.

D. Joint of Upper Layer Part 110A, Middle Layer Part 110B, Lower Layer Part 110C (FIG. 9, FIG. 10)

The upper layer part 110A, the middle layer part 110B and the lower layer part 110C are joined together. More specifically, the upper layer part 110A, the middle layer part 110B and the lower layer part 110C are layered and heated under pressure. In this event, the upper layer part 110A is placed upside down as compared to the state in FIG. 6.

Curing of the pre-pregs 36, 49 joins the upper layer part 110A, the middle layer part 110B and the lower layer part 110C together. In this event, the passive component 130 is housed and sealed in the through hole 37. Further, the conductive bump 48, the metal foil pattern 31A, and the conductive bump 32 are connected to each other to form the interlayer connecting part B3. The pre-preg 49 is connected to the insulating layer 33A to form the insulating layer 113. In this manner, the multilayer wiring board 110 having the passive component 130 built-in is formed.

Figure 11:
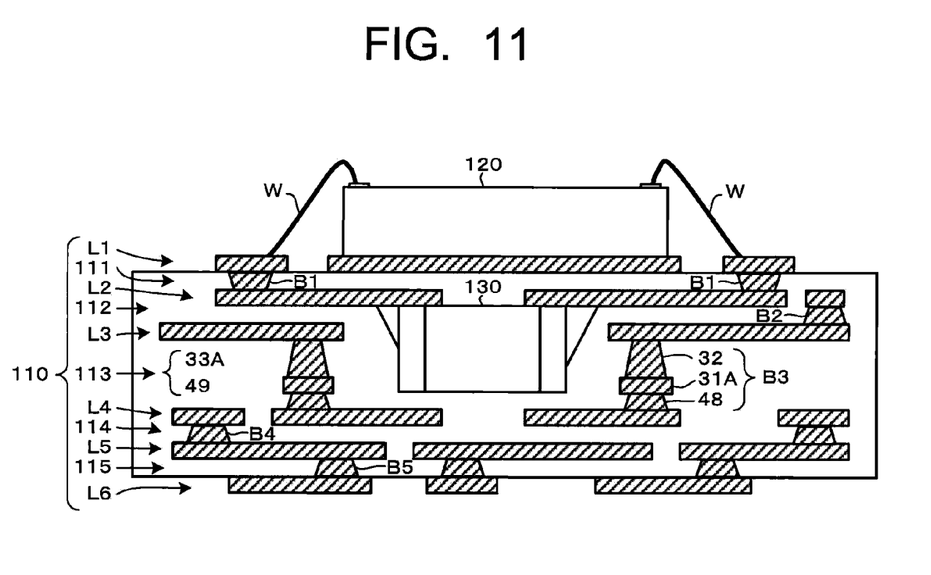
FIG. 11 is a view illustrating a manufacturing process of the electronic component illustrated in FIG. 1.
Figure 12:
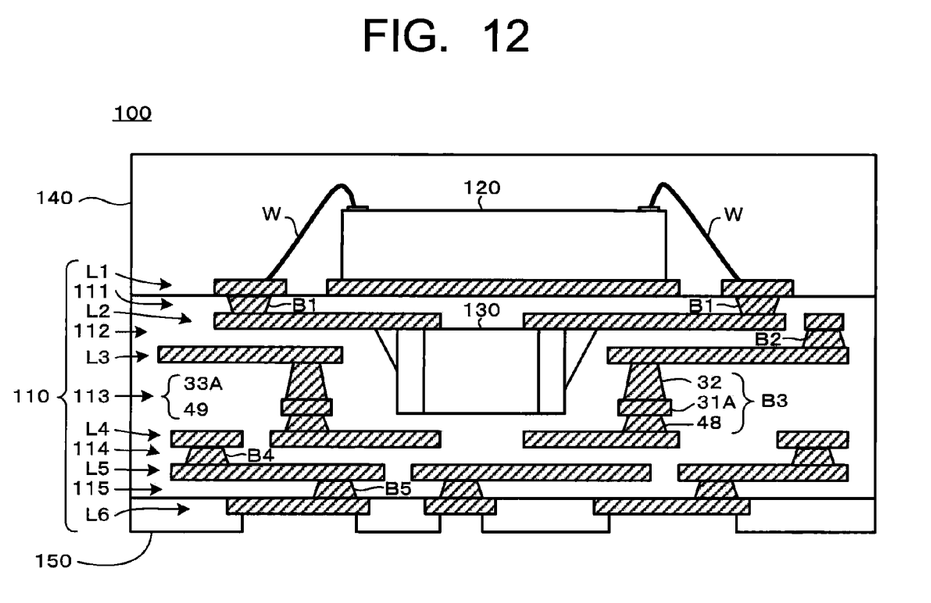
FIG. 12 is a view illustrating a manufacturing process of the electronic component illustrated in FIG. 1.

E. Fixing and Sealing of Semiconductor Chip 120 (FIG. 11, FIG. 12)

The semiconductor chip 120 is fixed on the multilayer wiring board 110 and electrically connected to the multilayer wiring board 110 via the wires W. Further, the semiconductor chip 120 is sealed with the sealing layer 140, and the protective layer 150 protects the lower surface of the multilayer wiring board 110.

In this manner, the electronic component 100 having the passive component 130 (for example, an adjustment resistor element) which will be a feedback element built-in is formed.

(Second Embodiment)

Figure 13:
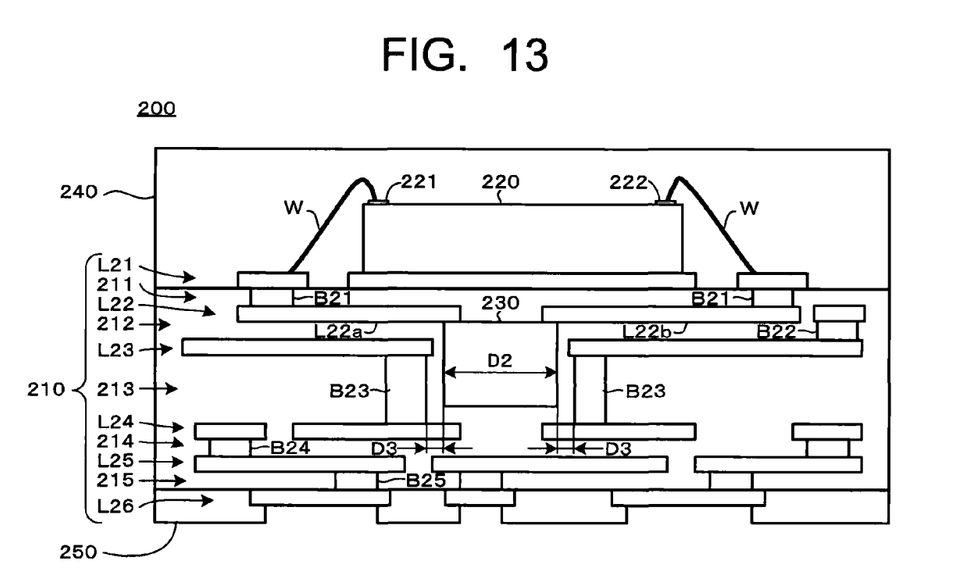
FIG. 13 is a sectional view illustrating an electronic component according to a second embodiment of the present invention.
Figure 14:
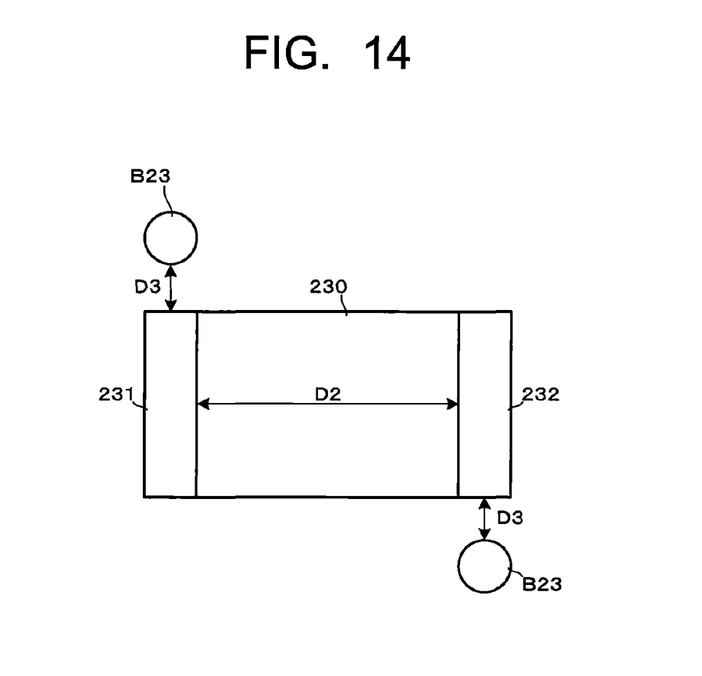
FIG. 14 is a plan view illustrating the vicinity of a passive component of the electronic component illustrated in FIG. 13.

FIG. 13 is a sectional view illustrating an electronic component 200 in a second embodiment of the present invention. FIG. 14 is a plan view illustrating the vicinity of a passive component 230 of the electronic component 200 illustrated in FIG. 13.

The electronic component 200 has a multilayer wiring board 210, a semiconductor chip 220, a passive component 230, a sealing layer 240, and a protective layer 250 as with the electronic component 100 in the first embodiment.

The multilayer wiring board 210 has insulating layers 211 to 215 and wiring layers L21 to L26. The wiring layers L21 to L26 are arranged in order from the bottom to the top and electrically insulated by the insulating layers 211 to 215 respectively. Note that the insulating layers 211 to 215 are layers made of an insulating material such as resin. Further, the wiring layers L21 to L26 are layers having respective wirings each constituted of a pattern of a conductive material such as metal. The wiring layers L21 to L26 are electrically connected to one other by interlayer connecting parts B21 to B25 such as conductive bumps.

In this embodiment, for example, the semiconductor chip 220 is composed of a semiconductor chip such as silicon and constitutes an amplifier (for example, an OP amplifier). Further, an input end 221 is provided at the left end on the upper face of the semiconductor chip 220 and an output end 222 is provided at the right end on the upper face of the semiconductor chip 220. The semiconductor chip 220 amplifies a signal inputted into the input end 221 and outputs it to the output end 222. Note that the input end 221 and the output end 222 are connected to wirings inside the wiring layer L21 of the multilayer wiring board 210 via wires W respectively.

In this embodiment, the passive component 230 is provided inside the multilayer wiring board 210 and directly under the semiconductor chip 220 so as to be opposed to the semiconductor chip 220. The first terminal 231 and the second terminal 232 of the passive component 230 are connected to the wiring layer L22 by solder or the like. As a result, the first terminal 231 and the second terminal 232 of the passive component 230 are connected to the input terminal 221 and the output terminal 222 of the semiconductor chip 220 via the wiring layer L22, the interlayer connecting parts B21, the wiring layer L21, and the wires W to constitute a feedback circuit.

The passive component 230 is a feedback element and is a chip component constituting, for example, an inductor, a capacitor, a resistor or the like.

The sealing layer 240 is, for example, a resin layer for sealing the semiconductor chip 220 to protect it from the outside.

The protective layer 250 is, for example, a resist layer for protecting the wiring layer L26 from the outside. The protective layer 250 is formed with openings and not-illustrated metal terminals for electrically connecting to an external circuit and an external element.

As illustrated in FIG. 13 and FIG. 14, the wirings L22a, L22b of the wiring layer L22 as the conductive member constituting the multilayer wiring board 210 are connected to the first terminal 231 and the second terminal 232 of the passive component 230, and interlayer connecting parts B23 are arranged close to them. Further, as compared to the distance D2 between the first terminal 231 and the second terminal 232, the distance D3 between the first terminal 231 and the second terminal 232 and the interlayer connecting parts B23 is smaller.

As a result of this, an AC noise generated from the first terminal 231 and the second terminal 232 of the passive component 230 is absorbed by the interlayer connecting parts B23. Accordingly, it is possible to prevent the AC noise from being superimposed on the semiconductor chip 220 and thereby electrically separate the input end 221 and the output end 222 of the semiconductor chip 220 from each other. Consequently, it is possible to prevent resonance of the semiconductor chip 220 to obtain a desired output signal and prevent breakage of the semiconductor chip 220.

Further, the interlayer connecting parts B23 can be connected to the ground. In this case, since the above-described AC noise is released to the outside of the multilayer wiring board, that is, the electronic component, it is possible to more effectively suppress the superimposition of the AC noise on the semiconductor chip 220 and to more surely achieve electrical separation between the input end 221 and the output end 222 of the semiconductor chip 220.

Note that though the interlayer connecting parts B23 are arranged close to the first terminal 231 and the second terminal 232 of the passive element 230 by the distance D3 in this embodiment, the above-described operation and effect can be provided only by arranging one of the interlayer connecting parts B23 close to the first terminal 231 or the second terminal 232 by the distance D3. However, the above-described operation and effect can be more effectively provided by arranging the interlayer connecting parts B23 close to the first terminal 231 and the second terminal 232 by the distance D3 respectively.

Further, the passive component 230 is disposed inside the multilayer wiring board 210 and directly under the semiconductor chip 220 so as to be opposed to the semiconductor chip 220 in this embodiment. Accordingly, the passive component 230 is shielded by the wiring layers L23 to L26 located below the passive component 230 and the semiconductor chip 220 located above the passive component 230 so that the flow of the external noise thereinto can be reduced. Further, since the arrangement of the passive component 230 directly under the semiconductor chip 220 reduces the wiring length between the passive component 230 and the semiconductor chip 220, the influence of the external noise on the passive component 230 can be further reduced.

(Third Embodiment)

Figure 15:
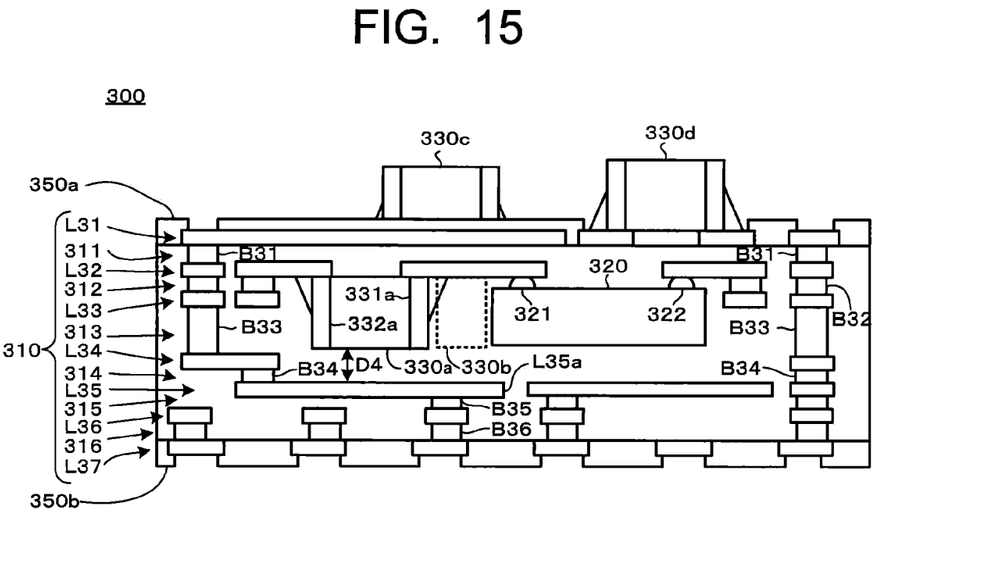
FIG. 15 is a sectional view illustrating an electronic component according to a third embodiment of the present invention.

FIG. 15 is a sectional view illustrating an electronic component 300 in a third embodiment of the present invention. The electronic component 300 has a multilayer wiring board 310, a semiconductor chip 320, passive components 330a to 330d, and protective layers 350a, 350b.

The multilayer wiring board 310 has insulating layers 311 to 316 and wiring layers L31 to L37. The wiring layers L31 to L37 are arranged in order from the bottom to the top and electrically insulated by the insulating layers 311 to 316 respectively. Note that the insulating layers 311 to 316 are layers made of an insulating material such as resin. Further, the wiring layers L31 to L37 are layers having wirings constituted of a pattern of a conductive material such as metal. The wiring layers L31 to L37 are electrically connected to each other by interlayer connecting parts B31 to B35 such as conductive bumps.

The semiconductor chip 320 is composed of a semiconductor chip such as silicon and arranged inside the multilayer wiring board 310 together with the passive components 330a, 330b. As the semiconductor chip 320, for example, a CSP (Chip Size Package) can be used. In other words, an ultra-compact package realized in a size similar to that of the semiconductor chip itself can be used as the semiconductor chip 320.

Note that another semiconductor chip may be arranged on a main surface of the multilayer wiring board 310 and sealed with resin or the like. In other words, the semiconductor chips can be arranged both on the main surface of and inside the multilayer wiring board 310.

In this embodiment, for example, the semiconductor chip 320 is composed of a semiconductor chip such as silicon and constitutes an amplifier (for example, an OP amplifier). Further, an input end 321 is provided at the left end on the upper face of the semiconductor chip 320 and an output end 322 is provided at the right end on the upper face of the semiconductor chip 320. The input end 321 and the output end 322 are connected to the wiring layer L32 by solder or the like. The semiconductor chip 320 amplifies a signal inputted into the input end 321 and outputs it to the output end 322.

The passive components 330a to 330d are chip components each constituting, for example, an inductor, a capacitor, a resistor or the like. The passive components 330a, 330b are arranged along with the semiconductor chip 320 inside the multilayer wiring board 310 and connected to wirings inside the wiring layer L32. The passive component 330b among them is disposed behind the cross-section (i.e., the view surface of FIG. 15) and is therefore indicated with a broken line. The passive components 330a, 330d are arranged on the main surface of the multilayer wiring board 310 and connected to the wiring layer L31 with solder or the like.

Figure 16:
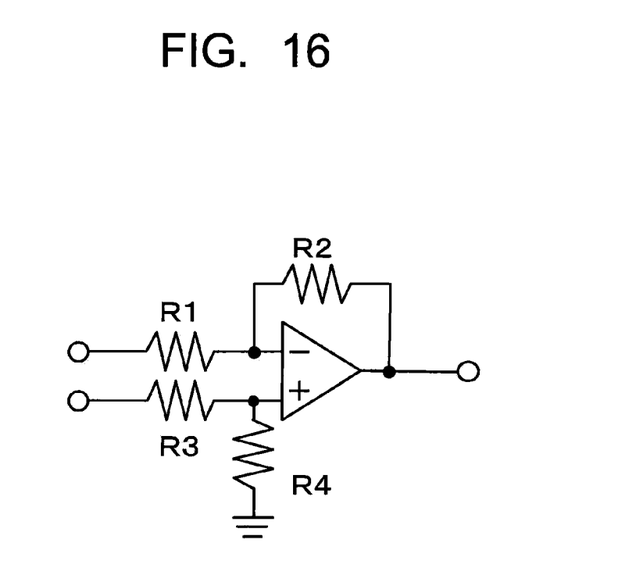
FIG. 16 is a circuit diagram illustrating an example of a circuit constituted by a semiconductor chip and a passive component of the electronic component illustrated in FIG. 1.

If all of the passive components 330a to 330d are resistors, the semiconductor chip 320 and the passive components 330a to 330d constitute a circuit equivalent to a feedback circuit illustrated in FIG. 16.

The protective layers 350a, 350b are formed with openings and not-illustrated metal terminals for electrically connecting to an external circuit and an external element.

As illustrated in FIG. 15, a first terminal 331a and a second terminal 332a of the passive component 330a and not-illustrated terminals of the passive component 330b are connected to the wiring layer L32 as the conductive member constituting the multilayer wiring board 310, and the wiring L35a of the wiring layer L35 is disposed close to the terminals. Further, as compared to the distance D2 between the first terminal 331a and the second terminal 332a of the passive component 330a and the distance between the not-illustrated terminals of the passive component 330b, the distance D4 between the terminals and the wiring L35a is smaller.

As a result of this, an AC noise generated from the first terminal 331a and the second terminal 332a of the passive component 330a and an AC noise generated from the not-illustrated terminals of the passive component 330b are absorbed by the wiring L35a. Accordingly, it is possible to prevent the AC noise from being superimposed on the semiconductor chip 320 and thereby electrically separate the input end 321 and the output end 322 of the semiconductor chip 320 from each other. Consequently, it is possible to prevent resonance of the semiconductor chip 320 to obtain a desired output signal and prevent breakage of the semiconductor chip 320.

Further, the wiring L35a can be connected to the ground. In this case, since the above-described AC noise is released to the outside of the multilayer wiring board 310, that is, the electronic component 300, it is possible to more effectively suppress the superimposition of the AC noise on the semiconductor chip 320 and to more surely achieve electrical separation between the input end 321 and the output end 322 of the semiconductor chip 320.

Further, the passive components 330a and 330b are disposed inside the multilayer wiring board 310. Accordingly, the passive components 330a and 330b are shielded by the wiring layers L31 to L36 of the multilayer wiring board 310 so that the flow of the external noise thereinto can be reduced.

The present invention has been described above based on the above-described concrete examples, and the present invention is not limited to the above-described concrete examples but is susceptible of all changes and modifications without departing from the scope of the present invention.

EXPLANATION OF SYMBOLS 100, 200, 300: electric component
110, 210, 310: multilayer wiring board
111 to 115, 211 to 215, 311 to 315: wiring layer
L1 to L6, L21 to L25, L31 to L35: insulating layer
L2a, L2b, L4a, L4b, L22a, L22b, L35a: wiring
120, 220, 330: semiconductor chip
121, 221, 321: input terminal
122, 222, 322: output terminal
130, 230, 330a to 330d: passive component
131, 231, 331a: first terminal
132, 232, 332a: second terminal
140, 240, 350: sealing layer
150, 250, 350a, 350b: protective layer

What is claimed is:

1. An electronic component, comprising:
   a multilayer wiring board including a conductive member and insulating layers;
   a semiconductor chip disposed on a main surface of or inside the multilayer wiring board; and
   a passive component disposed inside the insulating layers of the multilayer wiring board and having a first terminal and a second terminal connected to an input end and an output end of the semiconductor chip respectively,
   wherein the conductive member is disposed adjacent to the passive component but isolated from the passive component and at a position where a distance between the conductive member and at least one of the first terminal or the second terminal is smaller than a distance between the first terminal and the second terminal.

2. The electronic component according to claim 1, wherein the conductive member is disposed at a position where distances between the conductive member and the first terminal and the second terminal are smaller than the distance between the first terminal and the second terminal.

3. The electronic component according to claim 1, wherein the conductive member is connected to a ground.

4. The electronic component according to claim 1, wherein the conductive member is a wiring layer of the multilayer wiring board.

5. The electronic component according to claim 1, wherein the conductive member is an interlayer connecting part of the multilayer wiring board.

6. The electronic component according to claim 1, wherein the passive component and the semiconductor chip are arranged so as to be opposed to each other.

7. The electronic component according to claim 1, wherein the passive component is a feedback element for the semiconductor chip.

8. The electronic component according to claim 1, wherein the passive component is at least one selected from among an inductor, a capacitor, and a resistor.

* * * * *